US006991993B2

(12) United States Patent
Park et al.

(10) Patent No.: US 6,991,993 B2
(45) Date of Patent: Jan. 31, 2006

(54) METHOD OF FABRICATING TRENCH ISOLATION STRUCTURE OF A SEMICONDUCTOR DEVICE

(75) Inventors: Sang-Hun Park, Seoul (KR); Chung-Ho Lim, Yongin-Shi (KR); Sung-Gyu Park, Yongin-Shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 171 days.

(21) Appl. No.: 10/752,011

(22) Filed: Jan. 7, 2004

(65) Prior Publication Data

US 2004/0147091 A1    Jul. 29, 2004

(30) Foreign Application Priority Data

Jan. 24, 2003    (KR) ...................... 10-2003-0004808

(51) Int. Cl.
*H01L 21/762*    (2006.01)
(52) U.S. Cl. .................................... 438/424
(58) Field of Classification Search ................ 438/424
See application file for complete search history.

(56) References Cited

U.S. PATENT DOCUMENTS 6,146,975 A    11/2000   Kuehne et al.
2002/0004284 A1    1/2002    Chen

FOREIGN PATENT DOCUMENTS

| JP | 2000-036533 | 2/2000 |
| KR | 1998-083839 | 12/1998 |
| KR | 1020010009416 A | 2/2001 |
| KR | 2002-0002164 | 1/2002 |
| KR | 2002-0043908 | 6/2002 |

*Primary Examiner*—Evan Pert
(74) *Attorney, Agent, or Firm*—Volentine Francos & Whitt, PLLC

(57) ABSTRACT

The present invention provides a method of fabricating trench isolation structures of a semiconductor device. A conformal trench filler insulation layer is formed to fill wide and narrow trenches in a substrate. A portion of the trench filler insulation layer filling the wide trench is then removed. Next, a trench protection layer is formed on the trench filler insulation layer. The resultant structure is planarized to leave the trench protection layer over the wide width trench. Another planarization process is then carried out using the etch mask pattern and the remaining trench protection layer as a planarization stopper. Accordingly, the device isolation layer will attain a uniform planarity irrespective of the various widths of the trenches.

12 Claims, 10 Drawing Sheets

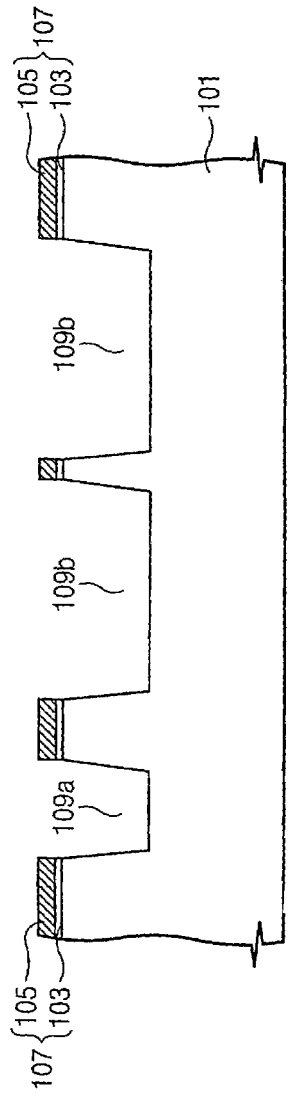
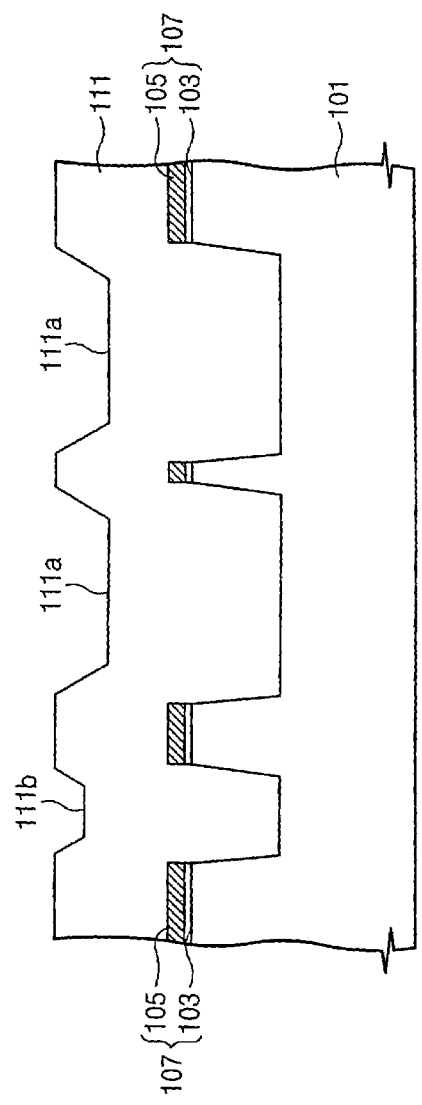

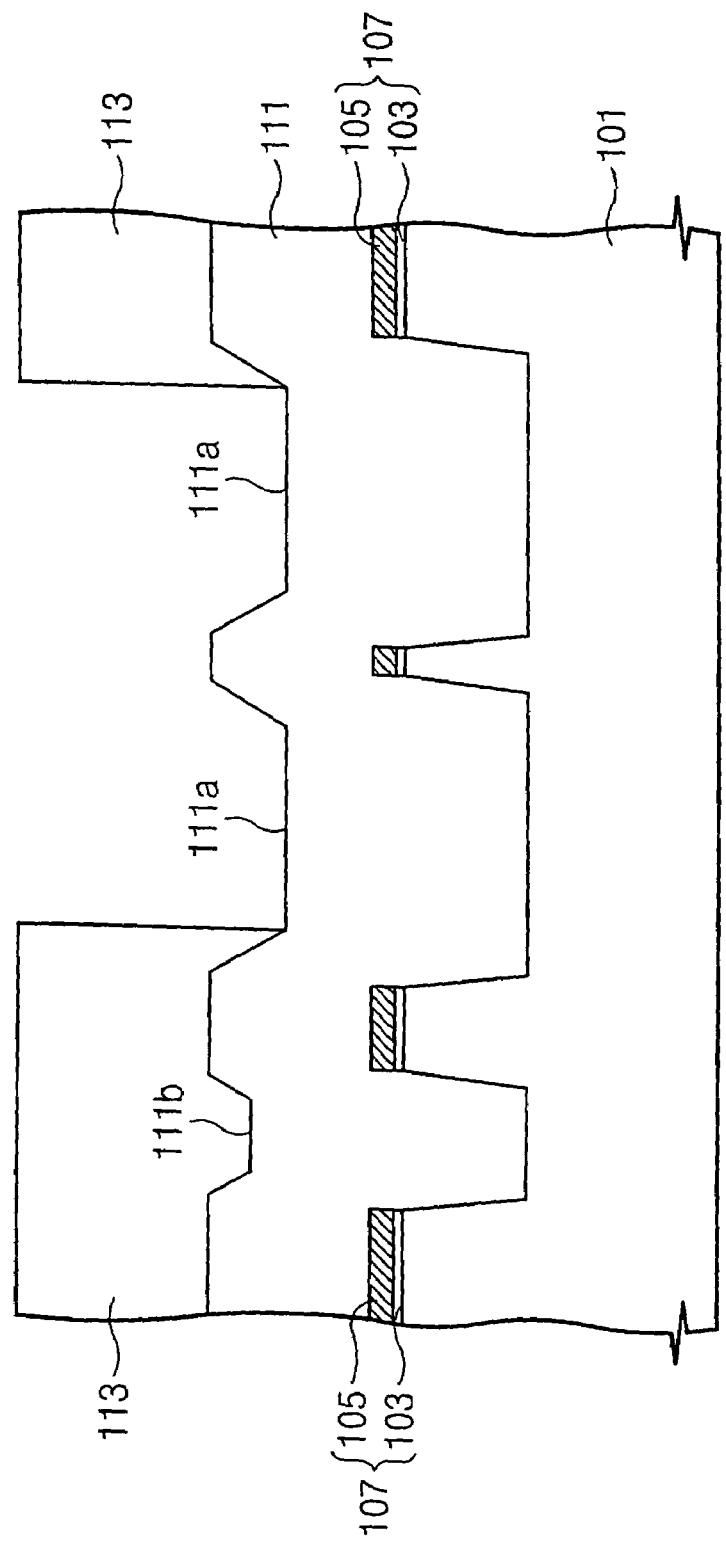

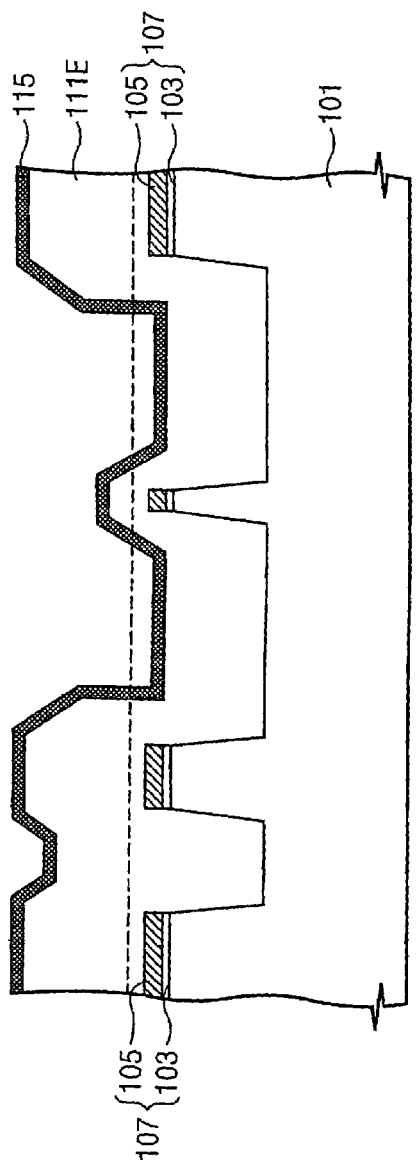
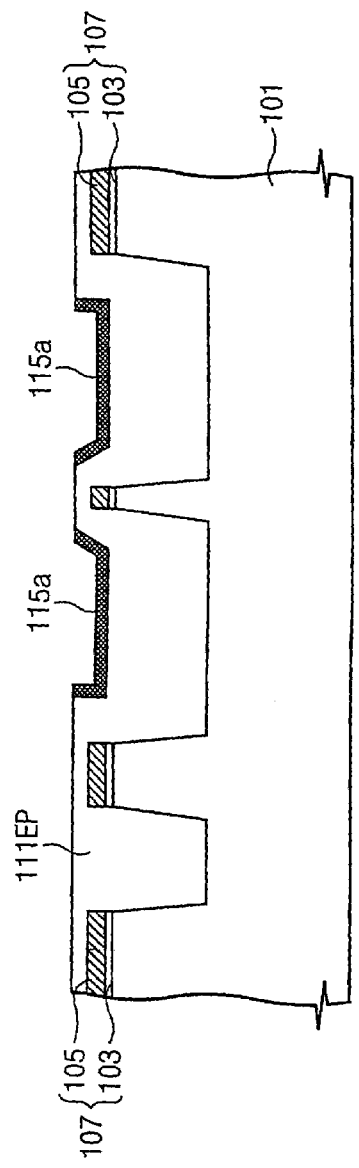

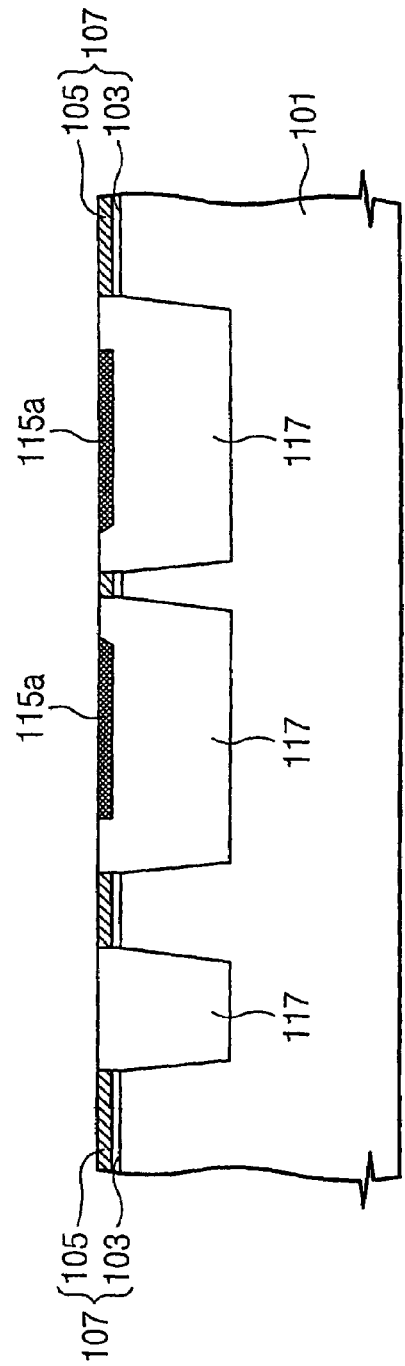
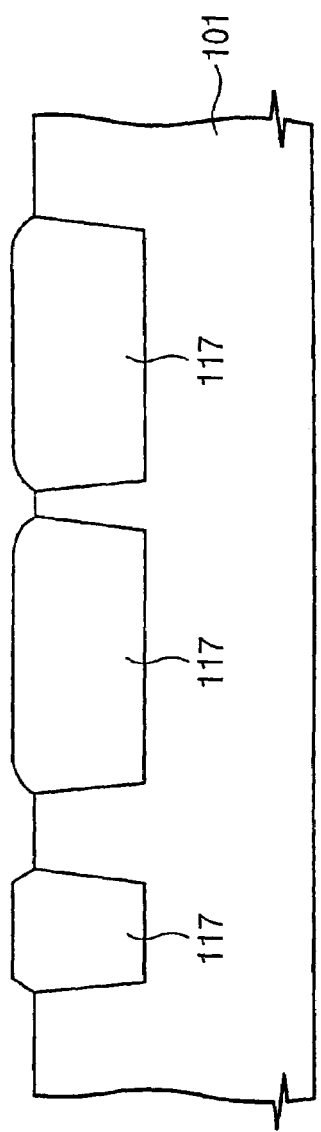

METHOD OF FABRICATING TRENCH ISOLATION STRUCTURE OF A SEMICONDUCTOR DEVICE

BACKGROUND OF THE INVENTION

1. Field of the Invention

The present invention relates to a semiconductor memory device. More specifically, the present invention relates to a method of fabricating trench isolation structure of a semiconductor device.

2. Description of the Related Art

The electrical characteristics or the reliability of a semiconductor device is highly dependent on the technology used to electrically isolate a device formed on a substrate of the semiconductor device. Improper device isolation results in leakage current, and loss of power supplied to a semiconductor chip.

Local oxidation of silicon (hereinafter referred to as "LOCOS") has been used as the device isolation technology. A typical LOCOS structure is formed by masking an active region with a pattern comprising layers of silicon nitride and pad oxide, implanting ions into an isolation region exposed by the patterned silicon nitride and pad oxide, and growing a thick field oxide in the isolation region. However, the typical LOCOS structure suffers from several problems, namely, the oxidation of silicon laterally under the masking layer which produces a so-called 'bird's beak' at the edge of the field oxide, and the lateral diffusion of the channel dopants wherein the dopants encroach the active region. In the case in of a lateral diffusion of channel stop dopants, the dopants attack the active region.

Shallow Trench Isolation (STI) technology has been widely used recently instead of LOCOS technology because of the above-described drawbacks of the LOCOS technology.

However, the STI technology presents problems related to the planarization of the resultant STI structure. That is, it is difficult to form a device isolation layer having a uniform planarity. In particular, the STI technology involves filling a wide trench with an isolation material, and then planarizing the isolation material. The isolation material is over-etched in the planarization process, whereby a so-called, "dishing" phenomenon occurs.

Techniques intended to prevent the dishing phenomenon from occurring in a trench protection layer produced according to STI technology are disclosed in U.S. Pat. No. 6,146,975 and Korean Laid-Open Patent Application No. 2002-0002164.

FIGS. 1 to 4 are cross-sectional views of a semiconductor substrate for schematically illustrating a method of forming a trench isolation structure as disclosed in U.S. Pat. No. 6,146,975, and FIGS. 5 to 9 are cross-sectional views of a semiconductor substrate for schematically illustrating a method of forming a trench isolation structure as disclosed in the Korean Laid-Open Patent Application No. 2002-0002164.

Referring to FIG. 1, a trench 25 is formed by masking a semiconductor substrate 21 with a pad oxide 22 and a mask nitride 23, and etching the underlying region of the semiconductor substrate exposed by the pad oxide 22 and mask nitride 23. Then, a trench insulation layer 27 is formed to fill the trench 25. The trench filler insulation layer 27 has a thickness that is equal to the depth of the trench 25 so as to terminate at the top of the trench 25.

Referring to FIG. 2, a polish stop layer 31 is formed on the trench filler insulation layer 27. A photoresist pattern (not shown) is formed on the polish stop layer 31.

Referring to FIG. 3, the portion of the polish stop layer 31 exposed by the photoresist pattern is etched, so that another portion the polish stop layer 31 remains over the trench 25.

Referring to FIG. 4, a planarization process is carried out on the trench filler insulating layer 27 using the remainder of the polish stop layer 31 and the mask nitride layer 23 as a planarization stopper.

However, if trenches having different widths are formed using this method, the respective portions of the polish stop layer remaining over the trenches have different thicknesses. That is, as shown in FIG. 5, the portion 31a of a polish stop layer left over a narrow trench is thicker than the portion 31b of the polish stop layer left over the wider trench. Accordingly, the planarization process (refer to the dotted line of FIG. 5) leaves the trench filler insulation layer over the mask nitride layer formed on the active region adjacent the narrow trench. Therefore, the mask nitride will remain on the active region even after a subsequent cleaning process intended to remove the mask nitride because the trench filler insulating layer covers the mask nitride during the cleaning process.

Also, the polish stop layer remaining in the trench may be etched during the planarization process because the trench filler insulation layer, which has the thickness corresponding to the depth of the trench, covers the mask nitride layer.

In this case, the polish stop layer could be formed thick to enhance its ability to control the planarization process. However, this technique necessitates that the silicon nitride polish stop layer remain over the trench during the photolithographic process. The thicker the silicon nitride polish stop layer, the greater the reflectivity of the exposure light becomes during the photolithographic process. Thus, a thick silicon nitride polish stop layer makes it difficult to implement the photolithographic process.

Now, another conventional approach will be described with reference to FIG. 6 through FIG. 9.

Referring first to FIG. 6, a trench filler insulation layer 120 is formed to fill a trench 'T'. Dishing protection layer 130 is formed on the trench filler insulation layer 120.

Next, referring to FIG. 7, an etching process is carried to leave the dishing protection layer 130' over only the trench T.

Next, referring to FIG. 8, an insulation layer 140 is formed on the trench filler insulation layer 120 and the dishing protection layer 130'. This is to guarantee the efficacy of the subsequent planarization process, i.e., to thereby prevent the dishing protection layer 130' from being etched.

Referring to FIG. 9, the device isolation is completed by performing the planarization process.

This method entails the forming of an additional insulation layer 140 as compared to the method disclosed in U.S. Pat. No. 6,146,975. Accordingly, the raw cost of the fabricating process is greater than that disclosed in U.S. Pat. No. 6,146,975, and the method is also subject to problems related to the process of forming the additional insulating layer.

SUMMARY OF THE INVENTION

Accordingly, an object of the present invention is to provide a method of fabricating trench isolation structure of a semiconductor substrate that substantially obviates one or more problems, limitations and disadvantages of the prior art.

According to one aspect of the invention, a method of fabricating trench isolation structure begins by forming trenches having different widths in a substrate using an etch mask pattern, followed by forming a conformal trench filler insulation layer on a semiconductor substrate to fill the trenches. The trench filler insulation layer thus has different thicknesses depending on the widths of the trenches. That is, the trench filler insulation layer will be comparatively thin over the wider of the trenches (i.e., the trench to be protected).

Then the trench filler insulation layer formed over the wide trench is etched using a photolithographic process to reduce the thickness thereof over the wide trench. More specifically, a photosensitive pattern is formed on the trench filler insulation layer to expose the trench filler insulation layer formed over the wide trench. The trench filler insulation layer is then etched using the photosensitive pattern as a mask. In this case, the top surface of that portion of the trench filler insulation layer filling wide trench becomes preferably disposed between the semiconductor substrate and the etching mask pattern formed on the semiconductor substrate.

A trench protection layer is then formed on the trench filler insulation layer. A planarization process is carried out to etch the trench protection layer and the trench filler insulation layer at regions outside of that of the wide trench until a portion of the trench protection layer over the wide trench remains. In this case, the upper surface of the trench protection layer remaining on the wide width trench may be located at substantially the same level as the upper surface of the trench etch mask pattern.

The trench protection layer may be formed of the same material as at least the top of the trench etch mask pattern. Accordingly, when a process is performed to remove the trench mask pattern, the remainder of the trench protection layer will be removed in the same process. Therefore, the cleaning of the substrate in this respect is a relatively simple process.

To this end, the trench etch mask pattern comprises nitride. Preferably, the trench etch mask pattern also comprises a pad oxide formed between the nitride and the semiconductor substrate.

BRIEF DESCRIPTION OF THE DRAWINGS

These and other objects, features and advantages of the present invention will become better understood from the following detailed description of the preferred embodiments thereof, made with reference to the accompanying drawings, in which:

FIG. 10 through FIG. 17 are cross-sectional views of a semiconductor substrate illustrating a method of fabricating a device isolation layer structure according to the present invention.

DETAILED DESCRIPTION OF THE PREFERRED EMBODIMENTS

Figure 1:
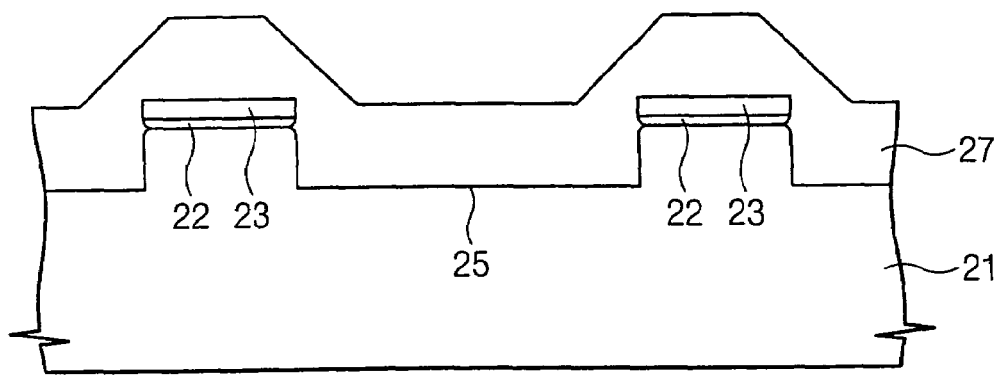
FIG. 1 through FIG. 4 are cross-sectional views of a semiconductor substrate illustrating a method of fabricating a device isolation structure according to the prior art.
Figure 2:
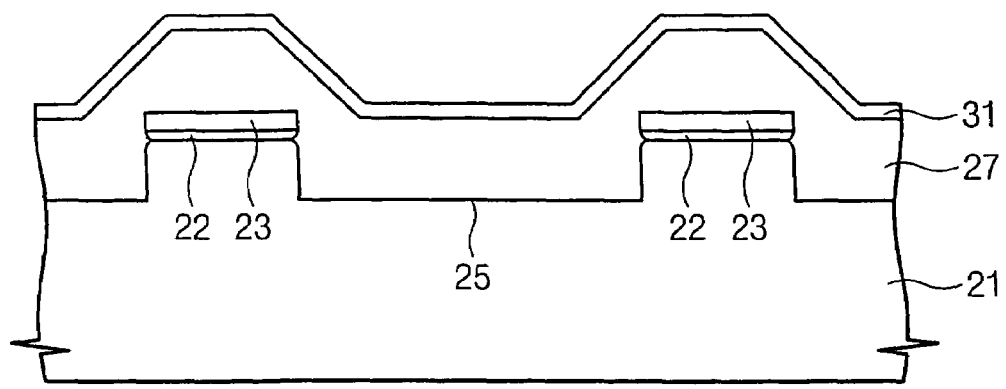
Figure 3:
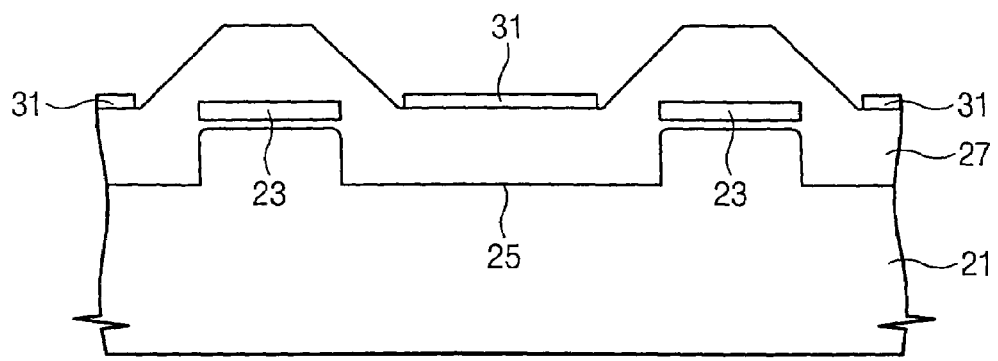
Figure 4:
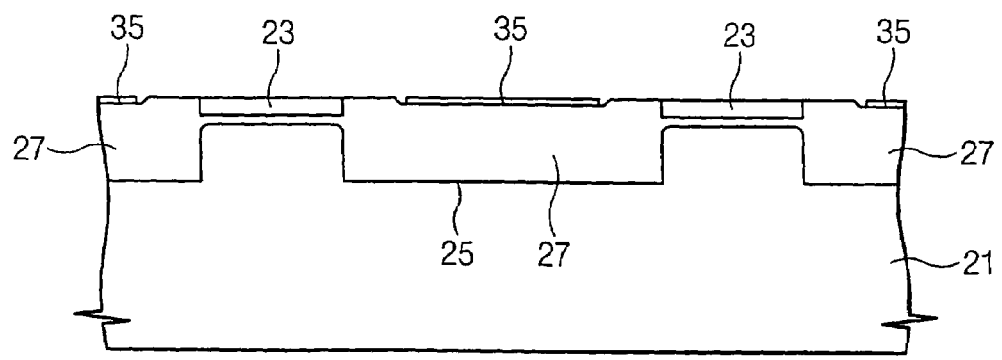
Figure 5:
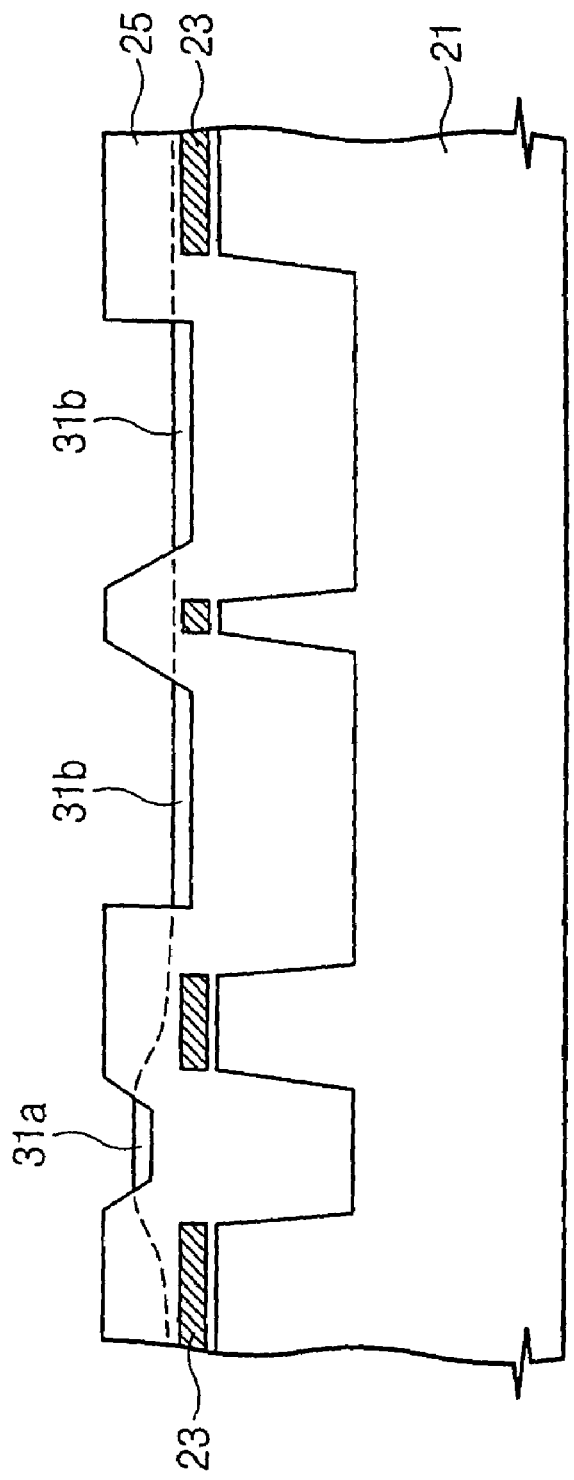
FIG. 5 is cross-sectional of view of a semiconductor substrate illustrating a problem that occurs when employing the method shown in FIGS. 1 through 4.
Figure 6:
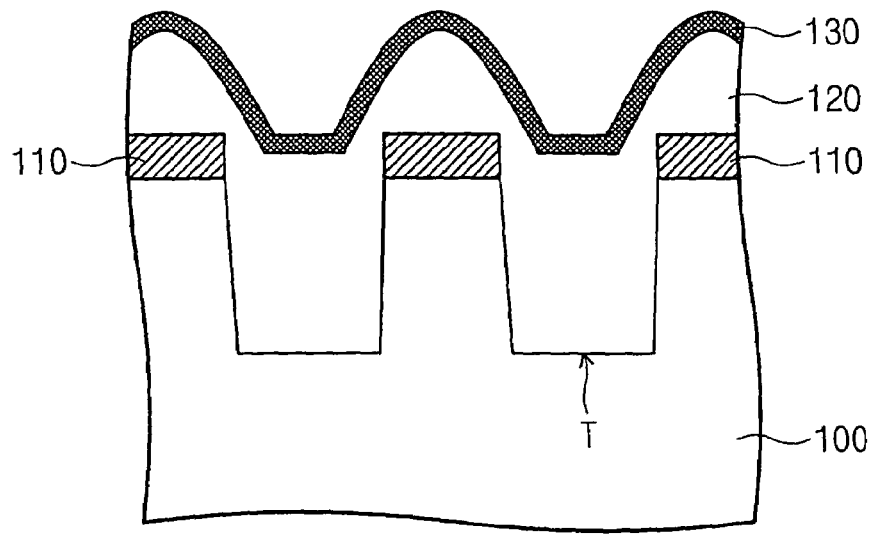
FIG. 6 through FIG. 9 are cross-sectional views of a semiconductor substrate illustrating another method of fabricating a device isolation layer structure according to the prior art.
Figure 7:
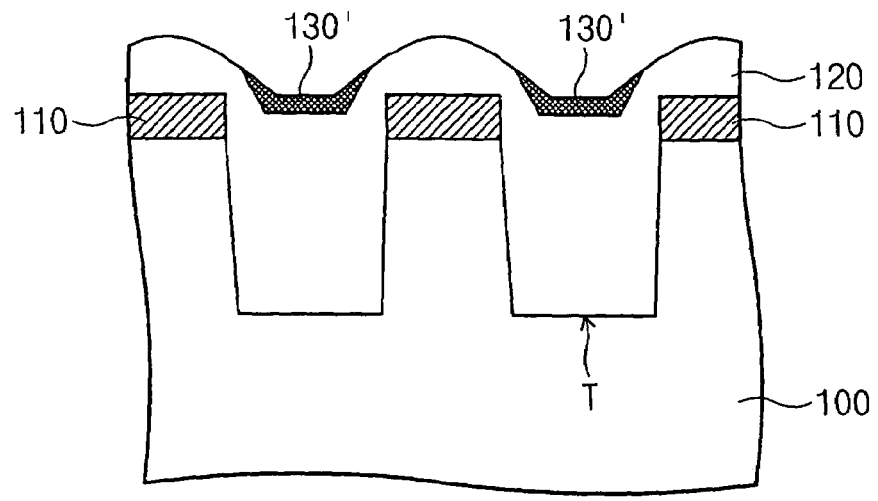
Figure 8:
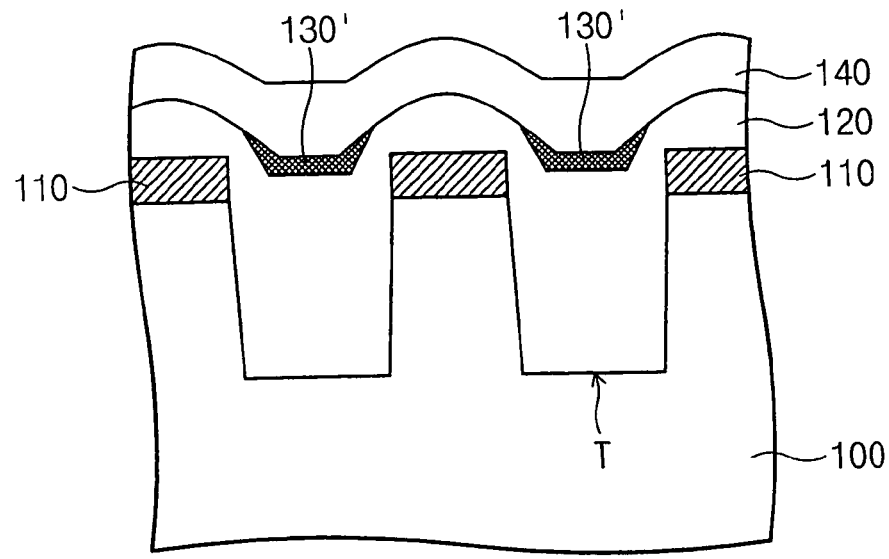
Figure 9:
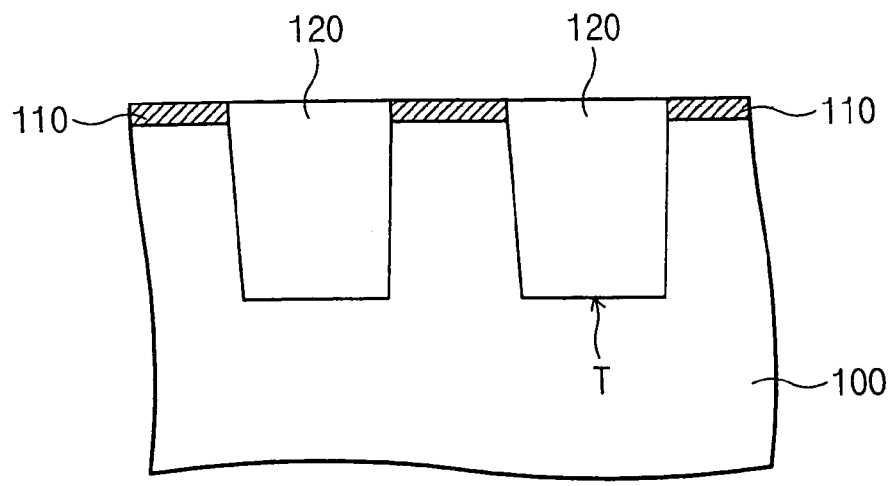

The present invention will now be described more fully hereinafter with reference to the accompanying drawings. In the drawings, the thickness of layers and regions are exaggerated for clarity. It will also be understood that when a layer is referred to as being "on" another layer or substrate, such a description refers to the referenced layer being disposed directly on the other layer or substrate, as well as additional layer(s) being interposed therebetween. Also, like reference numbers designate like elements throughout the drawings.

Referring now to FIG. 10, a trench etch mask pattern 107 is formed on a semiconductor substrate 101 to define an active region on the semiconductor substrate 101. More particularly, the portion of the semiconductor substrate 101 covered by the trench etch mask pattern 107 constitutes an active region and the portion of the semiconductor substrate exposed by the trench etch mask pattern 107 constitutes a device isolation region. The mask pattern 107 may consist of a pad oxide 103 and a mask nitride 105 sequentially stacked on the substrate. In this case, the mask pattern 107 is formed by sequentially forming an oxide layer and a nitride layer on the substrate and then, patterning the stacked layers. Also, the pad oxide 103 may be formed by a thermal oxidation process. The mask nitride 105 may be formed using low-pressure chemical vapor deposition. The mask nitride 105 protects the active region during subsequent processes.

Next, trenches 109a and 109b having different widths are formed by etching the semiconductor substrate 101 exposed by the mask pattern 107. That is, a comparatively narrow trench 109a and a comparatively wide trench 109b are formed. At this time, a thermal oxidation process may be performed to cure damage resulting from the etching process. This thermal oxidation process may cause the upper edges of the trenches to acquire rounded profiles.

Next, referring to FIG. 11, a trench filler insulation layer 111 is formed within trenches 109a and 109b and on the mask pattern 107 to fill the trenches 109a and 109b. The trench filler insulation layer 111 may be formed of high-density plasma or un-doped silicon glass layer (USG), for example. The trench filler insulation layer 111 is also formed to be significantly thicker than the depth of trenches 109a and 109b. More specifically, the trench filler insulation layer 111 is formed so as to extend approximately 5000–9000 Angstroms above the upper surface of the mask pattern 107. In this case, the trench filler insulation layer 111 conforms to the underlying structure comprising the semiconductor substrate 101 having trenches 109a and 109b of different widths. Accordingly, the trench filler insulation layer 111 has a non-planar surface (designated by reference numerals 111a, 111b, 111c). Note, again, that the lowest part 111a of the top surface of the trench filler insulation layer 111 is higher than the top surface of the trench etching mask pattern 107.

Referring to FIG. 12, a photosensitive pattern 113 is formed on the trench filler insulation layer 111 to expose the trench filler insulation layer over the wide trench 109b. For example, the photosensitive pattern 113 may be formed by spin-coating the structure with a photoresist, and then exposing and developing the resultant photoresist layer.

Figure 13:
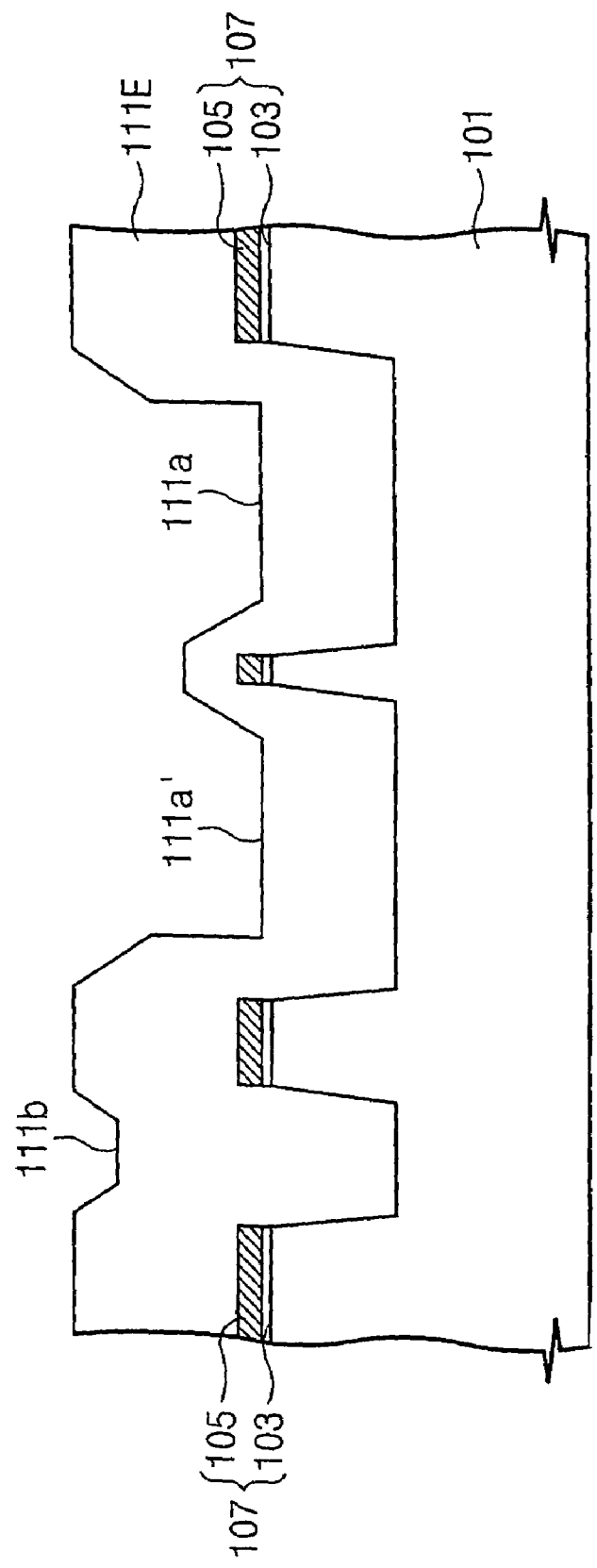

Referring to FIG. 13, the thickness of the trench filler insulation layer over the wide trench 109b is decreased by etching the trench filler insulation layer exposed by the photosensitive pattern 113. At this time, the top surface of the etched trench filler insulation layer 111a' should become disposed at a level between the top surface of the semiconductor substrate 101 and the top surface of etching mask pattern 107. Preferably, the trench filler insulation layer is etched to such an extent that the top surface of a trench protection layer, which is to be formed on the etched trench filler insulation layer, will be at substantially the same level as the top surface of the etching mask pattern. Accordingly, the trench etching mask pattern 107 will serve to protect the active region, whereas the trench protection layer will serve to protect the isolation region. As a result, the entire wafer can be planarized uniformly, and the dishing phenomenon can be prevented.

Next, referring to FIG. 14, the aforementioned trench protection layer 115 is formed on the etched trench filler insulation layer 111E after the photosensitive pattern 113 is removed. The trench protection layer 115 may be a nitride layer, for example. The trench protection layer 115 is formed to have a top surface level with or below that of the etch mask pattern 107 but higher than the top surface of the semiconductor substrate 101. The thickness to which the trench protection layer 115 is formed depends on the thickness of the trench etching mask pattern 107. For example, the trench protection layer 115 may be formed to a thickness of 100–1000 Angstroms if the trench etching mask pattern 107 is formed to a thickness of approximately 800 Angstroms.

Next, Referring to FIG. 15, a planarization process is performed in which the trench protection layer (hereinafter referred to "trench protection pattern") is left only on the wide trench 109b so as to protect the cpmparatively wide trench 109b. As distinguished from the prior art, the trench protection pattern 115a is not formed by a photo-etching process but by a global planarization process. Additionally, the planarization process may play a role in decreasing the thickness of those portions of the trench filler insulation layer 111E at regions other than at the region of the wide trench 109b. Accordingly, the technique afforded by the present invention provides a large process margin for the planarization process.

At this time, the planarization process simultaneously planarizes the trench protection layer 115 and the trench filler insulation layer 111 at regions other than the region of the wide width trench 109b. For instance, the trench protection layer 115 and the trench filler insulation layer 111 can be etched simultaneously by slurry that has little etch selectivity between the nitride of the trench protection layer 115 and the oxide of the trench filler insulation layer 111. The planarization process is carried out until the trench filler insulation layer 111EP is approximately 800–1000 Angstroms from the top surface of the etching mask pattern 107, for example.

Referring to FIG. 16, the remainder of the trench filler insulation layer 111EP is selectively etched by a planarization process using the trench etching mask pattern 107 and the trench protection layer 115a as a planarization stop layer. In this case, the planarization process uses a slurry having an excellent etch selectivity between the trench filler insulation layer and both the trench protection layer pattern and etch mask pattern. That is, the planarization process uses a slurry that etches the oxide of the trench filler insulation layer without etching the nitride of the trench protection layer pattern and the trench mask pattern. The trench etching mask pattern 107 and the trench protection layer pattern 115a protect the active region and the isolation layer, respectively, during this planarization process.

Referring to FIG. 17, the trench protection layer pattern 115a and mask nitride layer 105 of the trench etch mask pattern 107 are removed. For example, the mask nitride 105 may be removed using a phosphoric acid solution or by plasma etching. Next, the isolation layer 117 is formed by removing the pad oxide 103.

Subsequently, conventional processes such as those associated with the forming of a MOSFET may be performed.

According to the present invention, uniformity in the planarity of the active region and the isolation layer can be attained without the need for an additional insulation layer. The present invention also allows for freedom in the design thickness of the trench protection layer because the trench protection layer required to remain over the desired region is formed using a planarization process instead of a photolithography-based etching process.

Finally, although the present invention has been described above in connection with the preferred embodiments thereof, various changes to the preferred embodiments will become apparent to those of ordinary skill in the art. Therefore, the present invention is not limited to the embodiments described above. Rather, all changes that come within the scope of the appended claims are seen to be within the true spirit and scope of the present invention.

What is claimed is:

1. A method of fabricating a trench isolation structure of a semiconductor device, comprising:
    forming an etch mask pattern on a semiconductor substrate to expose respective areas of the substrate;
    forming a first trench having a first width and a second trench having a second width by etching the semiconductor substrate exposed by the etch mask pattern, the second width being greater than the first width;
    forming a trench filler insulation layer that fills the trenches and wherein the portion of the trench filler insulation layer filling the second trench has an upper surface disposed at a level no higher than that of the etch mask pattern, and the portion of the trench filler insulation filling the first trench has an upper surface disposed at a level higher than that of the etch mask pattern;
    subsequently forming a trench protection layer pattern on the portion of the trench filler insulation layer filling the second trench;
    subsequently removing material of the trench filler insulation layer by planarizing the structure using the etch mask pattern and the trench protection layer pattern as a planarization stopper, whereby the planarizing of the trench filler insulation layer terminates at the planarization stopper.

2. The method of claim 1, wherein said forming of the trench filler insulation layer comprises:
    forming a layer of insulation material on the substrate,
    forming a photosensitive pattern on the layer of insulation material that exposes the portion of the layer of insulation material that fills the second trench, and
    etching the layer of insulation material exposed by the photosensitive pattern until the upper surface of said portion thereof is located at a level between the upper surface of the etch mask pattern and the upper surface of the substrate.

3. The method of claim 1, wherein said forming of the trench protection layer pattern comprises:
    forming a trench protection layer on the trench filler insulation layer, and
    planarizing the structure to remove the portions of the trench protection layer pattern and the trench filler insulation layer that are disposed on the first trench while leaving a remainder of the trench protection layer and the trench filler insulation layer over the second trench.

4. The method of claim 3, wherein said planarizing used to form the trench protection layer pattern comprises polishing the trench protection layer with a slurry that has no etch selectivity between the trench protection layer and the trench filler insulation layer.

5. The method of claim 1, wherein said forming of an etch mask pattern comprises forming a pad oxide and a pad nitride sequentially on the semiconductor substrate.

6. The method of claim 5, wherein said forming of a trench protection layer pattern comprises forming a nitride layer on the trench filler insulation layer.

7. The method of claim 5, wherein said forming of a trench filler insulation layer comprises forming a high-density plasma oxide or a layer of un-doped silicon glass (USG) on the substrate.

8. A method of fabricating a trench isolation structure of a semiconductor device, comprising:
    forming an etch mask pattern on a semiconductor substrate to expose respective areas of the substrate;
    forming a first trench having a first width and a second trench having a second width by etching the semiconductor substrate exposed by the etch mask pattern, the second width being greater than the first width;
    forming a trench filler insulation layer on the etch mask pattern and which fills the trenches;
    forming a photosensitive pattern on the trench fitter insulation layer that exposes the portion of the trench filler insulation layer filling the second trench;
    etching the trench filler insulation layer exposed by the photosensitive pattern until the upper surface of said portion thereof is located at a level between the upper surface of the etch mask pattern and the upper surface of the substrate;
    subsequently forming a trench protection layer on the trench filler insulation layer;
    planarizing the structure to remove the portions of the trench protection layer pattern and the trench filler insulation layer that are disposed on the first trench while leaving a remainder of the trench protection layer and the trench filler insulation layer over the second trench as a trench protection layer pattern;
    subsequently removing material of the trench filler insulation layer by planarizing the structure using the etch mask pattern and the trench protection layer pattern as a planarization stopper, whereby the planarizing of the trench filler insulation layer terminates at the planarization stopper.

9. The method of claim 8, wherein said forming of a trench protection layer comprises forming a nitride layer on the trench filler insulation layer.

10. The method of claim 8, wherein said forming of an etch mask-pattern comprises:
    sequentially forming a pad oxide and a mask nitride on the semiconductor substrate, and
    patterning the mask nitride and the pad oxide.

11. The method of claim 8, wherein said forming of a trench filler insulation layer comprises forming a high-density plasma oxide or a layer of un-doped silicon glass (USG) on the substrate.

12. The method of claim 9, wherein said planarizing that forms the trench protection layer pattern comprises polishing the trench protection layer with a slurry that has no etch selectivity between the trench protection layer and the trench filler insulation layer.

* * * * *